United States Patent
Seo et al.

(10) Patent No.: US 10,455,711 B2
(45) Date of Patent: Oct. 22, 2019

(54) DISPLAY DEVICE HAVING A SUPPORT LEG

(71) Applicant: Samsung Display Co., Ltd., Yongin-si, Gyeonggi-do (KR)

(72) Inventors: Young Seok Seo, Yongin-si (KR); Mu Gyeom Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/820,800

(22) Filed: Nov. 22, 2017

(65) Prior Publication Data
US 2018/0184531 A1 Jun. 28, 2018

(30) Foreign Application Priority Data

Dec. 28, 2016 (KR) .......................... 10-2016-0181294

(51) Int. Cl.
| | | |
|---|---|---|
| *H05K 5/00* | (2006.01) | |
| *G06F 3/0488* | (2013.01) | |
| *H05K 5/02* | (2006.01) | |
| *H05K 5/03* | (2006.01) | |
| *G06F 3/044* | (2006.01) | |

(52) U.S. Cl.
CPC .......... *H05K 5/0017* (2013.01); *G06F 3/044* (2013.01); *G06F 3/0488* (2013.01); *H05K 5/0234* (2013.01); *H05K 5/03* (2013.01); *G06F 2200/1612* (2013.01); *G06F 2200/1613* (2013.01)

(58) Field of Classification Search
None
See application file for complete search history.

(56) References Cited

U.S. PATENT DOCUMENTS

| | | | | |
|---|---|---|---|---|
| D645,867 S | * | 9/2011 | Wong .......................... | D14/447 |
| 8,050,032 B2 | * | 11/2011 | Trang .................... | G06F 1/1613 |
| | | | | 361/679.59 |
| 8,139,357 B2 | * | 3/2012 | Trang ...................... | G06F 1/203 |
| | | | | 361/679.59 |
| D728,580 S | * | 5/2015 | Campbell .................... | D14/447 |
| 2007/0157856 A1 | * | 7/2007 | Skoog .................. | A47B 81/061 |
| | | | | 108/70 |
| 2008/0174947 A1 | * | 7/2008 | Chang .................. | G06F 1/1616 |
| | | | | 361/679.27 |

(Continued)

FOREIGN PATENT DOCUMENTS

| | | |
|---|---|---|
| KR | 10-1164483 | 7/2012 |
| KR | 10-1676447 | 11/2016 |

*Primary Examiner* — David D Davis
(74) *Attorney, Agent, or Firm* — Lewis Roca Rothgerber Christie LLP

(57) ABSTRACT

A display device includes a display panel including a plurality of pixels configured to display an image, and further including a light blocking member on the pixels to define a display area and a non-display area, the light blocking member having a curvature part, and a supporting leg connected to a first surface of the display panel to support the display panel, wherein the plurality of pixels include a first pixel that does not overlap with the curvature part from a plan view, and a second pixel partial overlapping with the curvature part, wherein the first and second pixels are configured to display the image on a second surface of the display panel opposite to the first surface.

16 Claims, 15 Drawing Sheets

(56) References Cited

U.S. PATENT DOCUMENTS

| | | | | |
|---|---|---|---|---|
| 2009/0143141 A1* | 6/2009 | Wells | ............... | G07F 17/32 |
| | | | | 463/37 |
| 2010/0151953 A1* | 6/2010 | Kuhn | ............... | A47B 25/00 |
| | | | | 473/15 |
| 2010/0289994 A1* | 11/2010 | Nonaka | ............ | G02F 1/133514 |
| | | | | 349/108 |
| 2014/0197380 A1* | 7/2014 | Sung | ............... | H01L 27/3241 |
| | | | | 257/40 |
| 2014/0292621 A1* | 10/2014 | Kim | ............... | H04N 5/64 |
| | | | | 345/76 |
| 2017/0322446 A1* | 11/2017 | Tae | ............... | G02F 1/133345 |

\* cited by examiner

DISPLAY DEVICE HAVING A SUPPORT LEG

CROSS-REFERENCE TO RELATED APPLICATIONS

This application claims priority to, and the benefit of, Korean Patent Application No. 10-2016-0181294, filed on Dec. 28, 2016, in the Korean Intellectual Property Office, the entire disclosure of which is incorporated by reference herein.

BACKGROUND

1. Field

An aspect of the present disclosure relates to a display device.

2. Description of the Related Art

Display devices are classified into liquid crystal displays (LCDs), organic light emitting diode displays (OLED displays), plasma display panels (PDPs), electrophoretic displays (EPDs), and the like, according to their light emitting methods.

As interest in information displays and demand for portable information media increase, research and commercialization has centered on display devices.

As wearable devices such as smart watches or head mount display devices are used in various fields, demand for display devices including a display area having a curvature has recently increased.

SUMMARY

Aspects of embodiments are directed toward a display device in which a display panel including a curved corner portion is available in various configurations.

According to an embodiment of the present disclosure, there is provided a display device including: a display panel including a plurality of pixels configured to display an image, and further including a light blocking member on the pixels to define a display area and a non-display area, the light blocking member having a curvature part; and a supporting leg connected to a first surface of the display panel to support the display panel, wherein the plurality of pixels include: a first pixel that does not overlap with the curvature part from a plan view; and a second pixel partial overlapping with the curvature part, wherein the first and second pixels are configured to display the image on a second surface of the display panel opposite to the first surface.

In an embodiment, one end portion of the supporting leg is rotatably connected to the display panel.

In an embodiment, an other end portion of the supporting leg is formed in a spherical shape.

In an embodiment, the supporting leg is configured to have an adjustable length.

In an embodiment, the supporting leg includes: a first supporting stick extending from the display panel; and a second supporting stick extending from the first supporting stick, wherein one end portion of the second supporting stick is rotatably connected to the first supporting stick.

In an embodiment, the display panel further includes a mounting groove that allows the supporting leg to be mounted on the first surface.

In an embodiment, from the plan view, a circumference of the display panel has a straight line and a curve having a first curvature, and the mounting groove has a shape corresponding to the curve and has a second curvature.

In an embodiment, the supporting leg has a shape corresponding to the mounting groove and is configured to be mounted in the mounting groove.

In an embodiment, the supporting leg includes: a first supporting part extending along a first direction; a second supporting part extending along a second direction crossing the first direction; and a curved surface part connecting the first supporting part and the second supporting part to each other.

In an embodiment, when the first supporting part is rotated in the mounting groove, the second supporting part is detached from the mounting groove, and when the second supporting part is rotated in the mounting groove, the first supporting part is detached from the mounting groove.

In an embodiment, the first curvature and the second curvature are equal to each other.

In an embodiment, the first curvature and the second curvature are different from each other.

In an embodiment, the display device further includes: a first touch sensor on the second surface; and a second touch sensor on a side surface of the display panel, the side surface connecting a circumference of the first surface and a circumference of the second surface to each other.

In an embodiment, the side surface of the display panel includes a plurality of touch areas defined by the second touch sensor, the second touch sensor is configured to allow the touch areas to be all activated, or to allow some of the touch areas to be activated and others of the touch areas to be non-activated.

In an embodiment, the second touch sensor is configured to allow the touch areas to be activated or non-activated corresponding to an angle formed between the first surface of the display panel and the ground.

In an embodiment, the supporting leg supports the display panel such that the second surface of the display panel extends in a direction crossing the ground.

In an embodiment, the supporting leg supports the display panel such that the second surface of the display panel extends in a direction normal to the ground.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the figures, dimensions may be exaggerated for clarity of illustration. Like reference numerals refer to like elements throughout.

DETAILED DESCRIPTION

Figure 1:
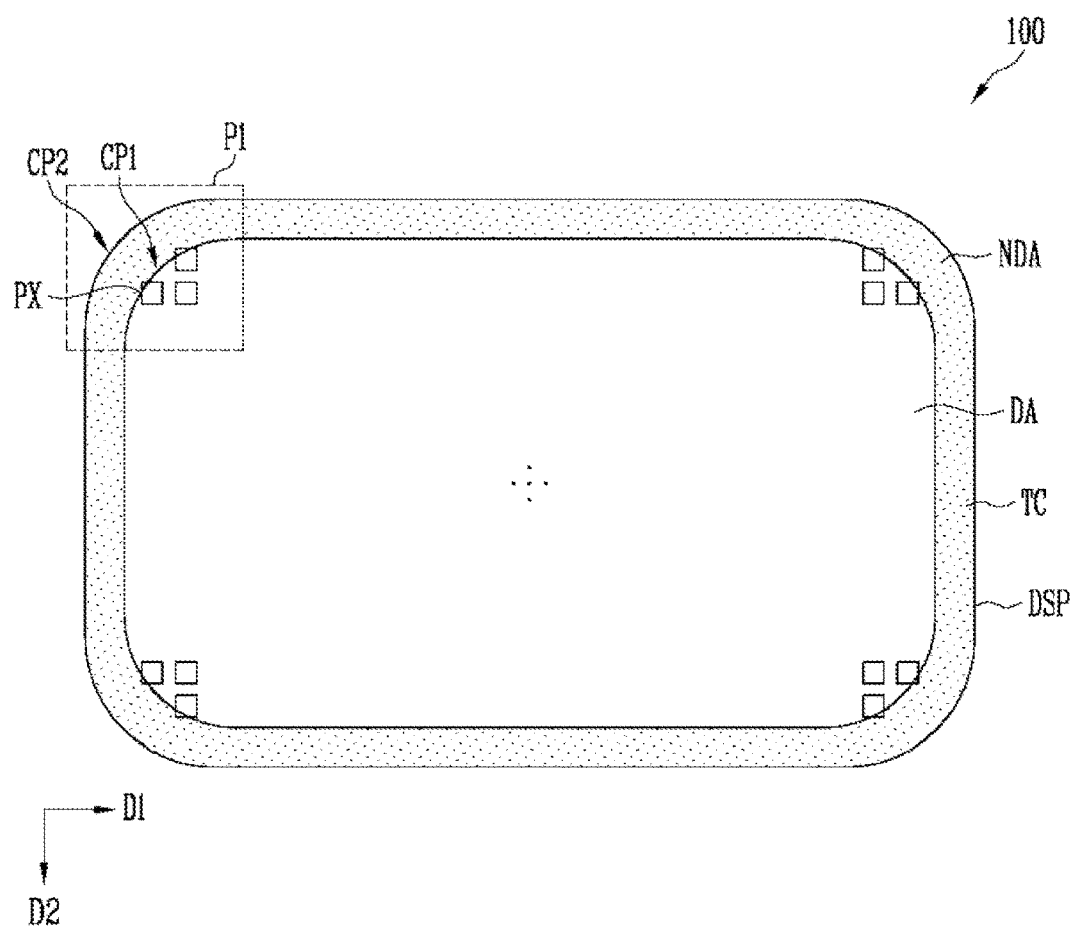
FIG. 1 is a plan view of a display device according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

The embodiments according to the concept of the present disclosure can be variously modified, as suitable, and have various suitable shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first", "second", and "third", etc., may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept."

As used herein, the terms "use," "using," and "used" may be considered synonymous with the terms "utilize," "utilizing," and "utilized," respectively.

So long as not differently defined, all terms used herein, including technical or scientific terminologies, have meanings that they are commonly understood by those skilled in the art to which the present disclosure pertains. The terms having definitions as defined in the dictionary should be understood such that they have meanings consistent with the context of the related disclosure. When not clearly defined in this application, terms should not be understood in an ideally or excessively formal way.

Figure 2:
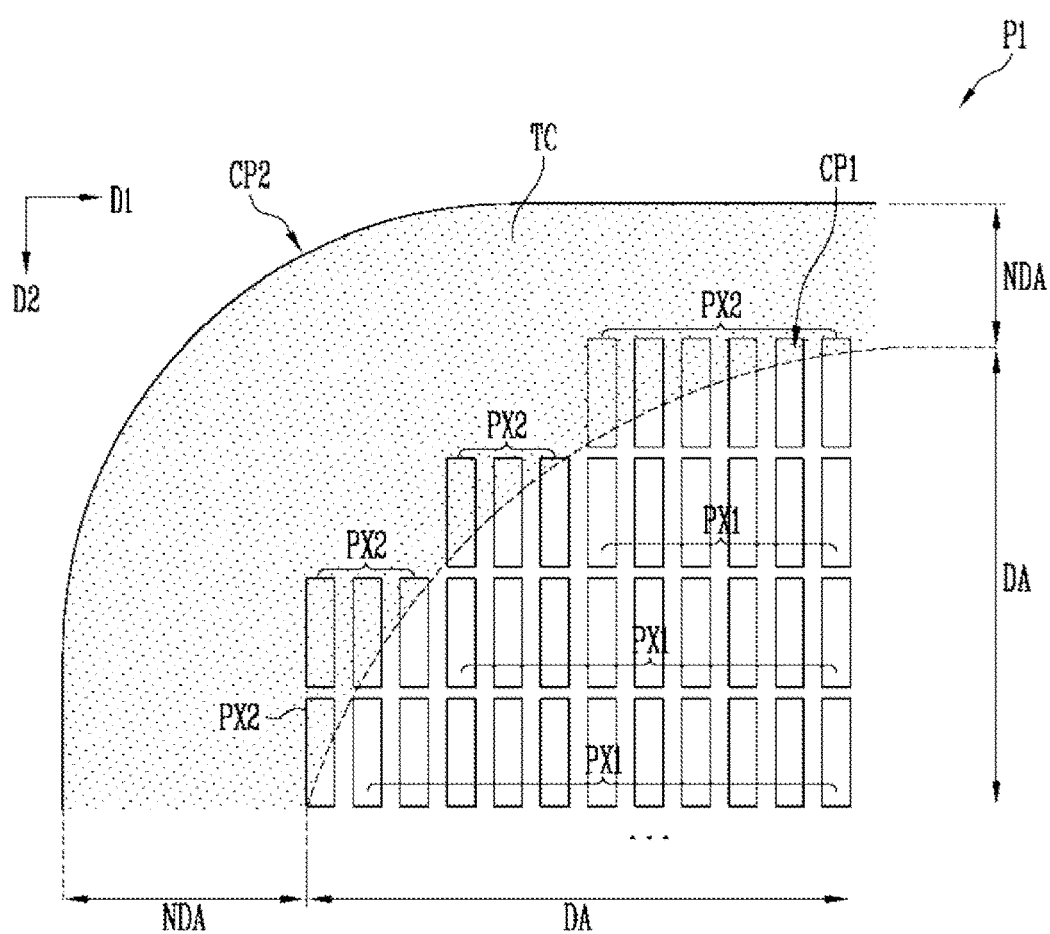
FIG. 2 is an enlarged view of area P1 of FIG. 1.

FIG. 1 is a plan view of a display device according to an embodiment of the present disclosure. FIG. 2 is an enlarged view of area P1 of FIG. 1.

Referring to FIG. 1, the display device 100 according to the embodiment of the present disclosure includes a display panel DSP that displays an image.

The display panel DSP may include a display area DA in which an image is displayed and a non-display area NDA that surrounds the periphery of the display area DA.

The display area DA may be formed in a shape corresponding to the display panel DSP, and the non-display area NDA may be provided at at least one side of the display area DA. In an embodiment of the present disclosure, a case where the non-display area NDA is formed in a shape surrounding the display area DA is illustrated. However, in another embodiment, the non-display area NDA may be disposed in only the remaining area at one side, and not at any other sides, of the display area DA.

Pixels PX may be arranged in the display area DA, and have the same structure. The pixel PX is a minimum unit that displays an image, and may include an organic light emitting device that emits white light or colored light.

For example, the pixel PX may emit light of any one color among red, green, and blue. However, the present disclosure is not limited thereto, and the pixel PX may emit light of any one color among cyan, magenta, and yellow.

The pixels PX may be arranged in a matrix form. However, the arrangement of the pixels PX is not particularly limited, and the pixels PX may be arranged in various suitable forms such as a step form.

A light blocking member TC that defines the display area DA and the non-display area NDA may be disposed on the display panel DSP. That is, an area in which the light blocking member TC is not disposed on the display panel DSP is the display area DA in which an image is displayed, and an area in which the light blocking member TC is disposed on the display panel DSP is the non-display area NDA in which no image is displayed.

The light blocking member TC may include two surfaces extending in a first direction D1, two surfaces extending in a second direction, and four curved surfaces that connect the surfaces.

The outer circumference of the light blocking member TC is provided in a shape corresponding to the display panel DSP. In an embodiment of the present disclosure, the display panel DSP may be provided in a rectangular shape having curved corners, and the light blocking member TC may be provided in a rectangular shape having curved corners to correspond to the display panel DSP.

In addition, an area corresponding to the display area DA may be opened inside the light blocking member TC, and an image displayed in the display area DA may be exposed to the outside through the opened area. In this case, the inner circumference of the light blocking member TC may have a shape corresponding to the outer circumference of the light shielding member TC such that the display area DA has a rectangular shape having curved corners. That is, the inner circumference of the light blocking member TC may be provided in a rectangular shape having curved corners.

A curve CP2 of the outer circumference of the light blocking member TC and a curve CP1 of the inner circumference of the light blocking member TC may have the same curvature. However, the present disclosure is not limited thereto, and a first curvature of the outer circumference and a second curvature of the inner circumference may be different from each other. In addition, for some curved surfaces among the four curved surfaces (e.g., at the four curved corners) of the light blocking member TC, the first and second curvatures may be equal to each other, and for other curved surfaces, the first and second curvatures may be different from each other.

A data driver for providing a data signal to the pixels PX and data lines that connect the data driver to the pixels PX may be disposed in the non-display area NDA. In addition, a scan driver for providing a scan signal to the pixels PX and scan lines that connect the scan driver to the pixels PX may be disposed in the non-display area NDA.

The data lines and the scan lines may be disposed to extend from the non-display area NDA to the display area DA. In this case, each of the data lines may be connected to all pixels PX provided on each pixel column, and the pixels PX on the same column may share the same data line. In addition, each of the scan lines may be connected to all pixels PX provided on each pixel row, and the pixels PX on the same row may share the same scan line.

The display device 100 may be implemented as a mirror type (kind) display device. That is, the display panel DSP may include a metal layer having a light reflection property. When no image is displayed in the display panel DSP, light incident onto the display panel DSP from the outside may be reflected by the metal layer. Accordingly, the display device 100 may behave as a mirror that allows an object or the like, which is disposed on a front surface of the display panel DSP, to be displayed thereon.

Referring to FIG. 2, a plurality of pixels may include first pixels PX1 that do not overlap with a curvature part of the light blocking member TC and second pixels PX2 that overlap with the curvature part. Here, the curvature part may refer to an area disposed between the curve CP1 of the inner circumference of the light blocking member TC and the curve CP2 of the outer circumference of the light blocking member TC.

The first pixels PX1 may be arranged in the form of steps in an area adjacent to the curvature part, and be arranged in a matrix form in the remaining area of the display area DA.

The second pixels PX2 may be arranged in the form of steps in an area adjacent to the curvature part. However, the present disclosure is not limited thereto, and the second pixels PX2 may be arranged in a matrix form.

Emission areas of the first and second pixels PX1 and PX2 may be the same as each other. However, the present disclosure is not limited thereto, and the emission area of the first pixels PX1 may be wider than that of the second pixels PX2.

In FIG. 2, it is illustrated that a width (e.g., along the second direction D2) of the light blocking member TC extending in the first direction D1 is narrower than the width (e.g., along the first direction D1) of the light blocking member TC extending in the second direction D2. However, the present disclosure is not limited thereto, and the width of the light blocking member TC extending in the first direction D1 may be wider than or equal to that of the light blocking member TC extending in the second direction D2.

Figure 3A:
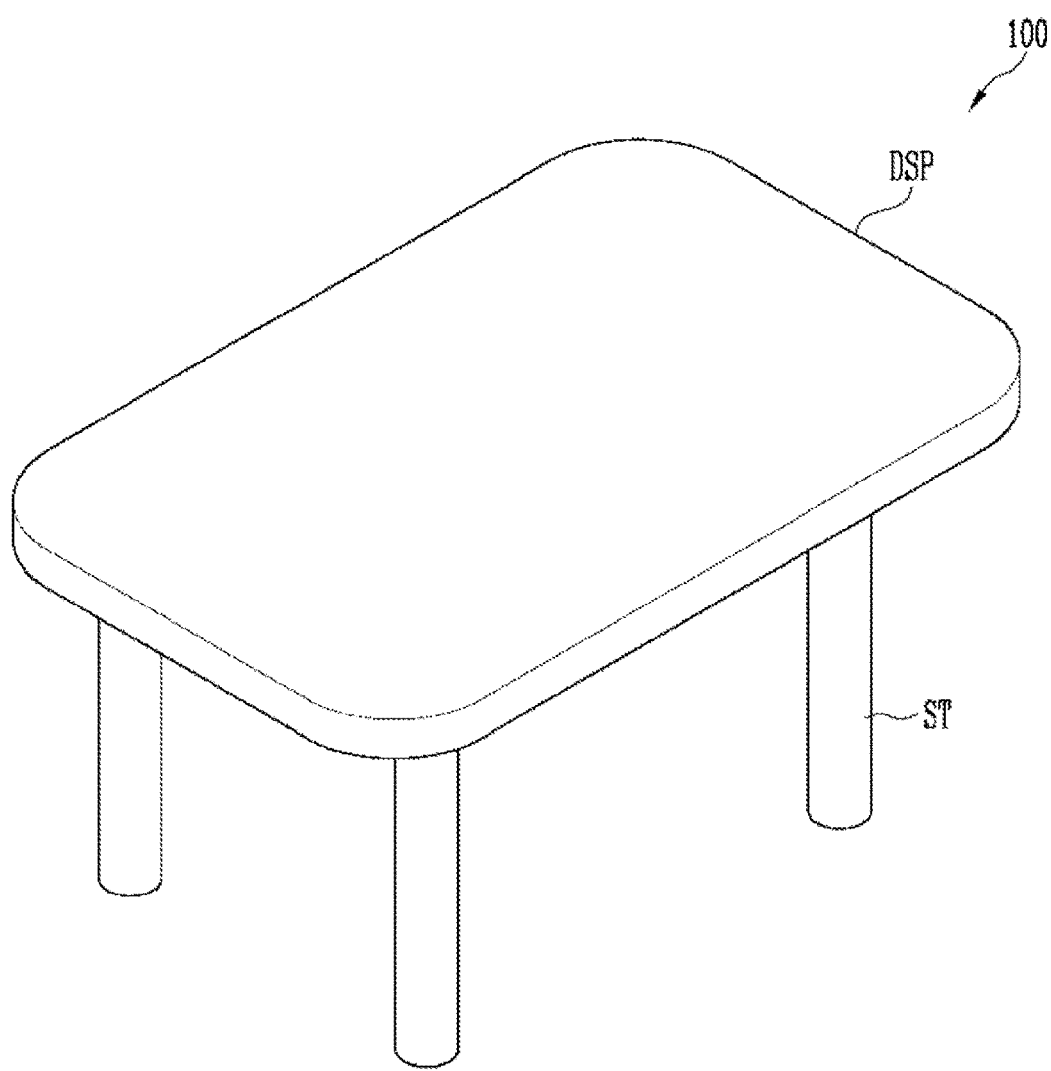
FIG. 3A is a perspective view of a display device according to a first embodiment of the present disclosure.
Figure 3B:
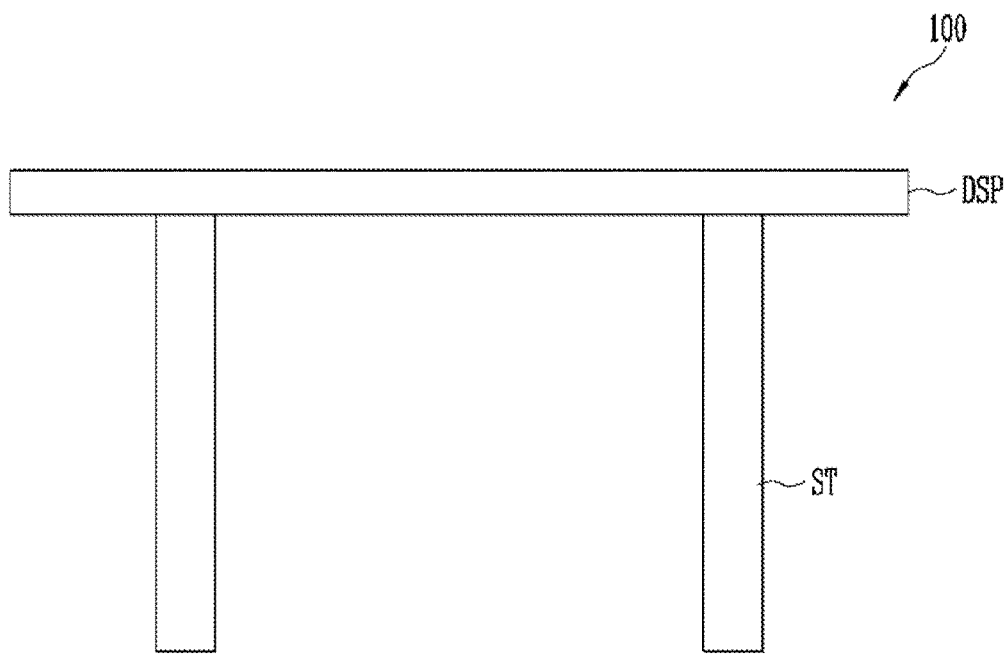
FIG. 3B is a side view of the display device according to the first embodiment of the present disclosure.
Figure 3C:
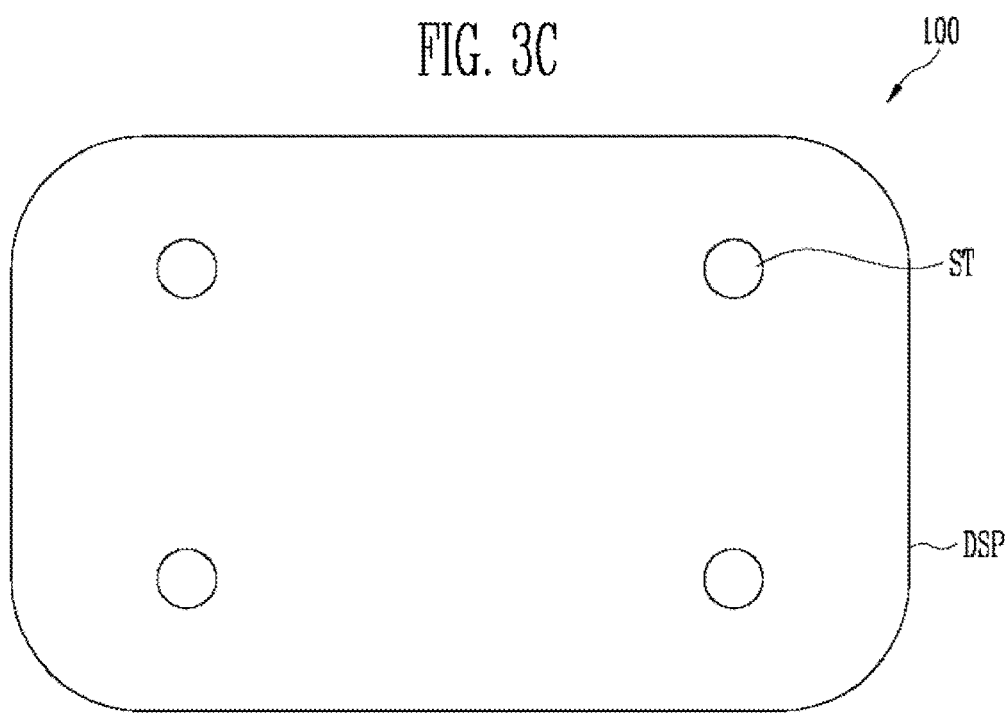
FIG. 3C is a bottom view of the display device according to the first embodiment of the present disclosure.

FIG. 3A is a perspective view of a display device according to a first embodiment of the present disclosure. FIG. 3B is a side view of the display device according to the first embodiment of the present disclosure. FIG. 3C is a bottom view of the display device according to the first embodiment of the present disclosure.

Referring to FIGS. 3A to 3C, the display device 100 may include supporting legs ST, and the supporting legs ST may be connected to a first surface of a display panel DSP. Here, the first surface of the display panel DSP refers to a surface on which no image is displayed, and a second surface of the display panel DSP opposite to the first surface refers to a surface on which an image is displayed. However, the present disclosure is not limited thereto, and the display panel DSP may concurrently (e.g., simultaneously) display an image through the first and second surfaces.

The supporting leg ST may be connected to the display panel DSP at a position adjacent to a curved portion of the display panel DSP. However, the present disclosure is not limited thereto, and the supporting leg ST may be connected to the display panel DSP at various suitable positions such as a position adjacent to a central portion of the display panel DSP.

The supporting legs ST may support the display panel DSP such that display panel DSP can be used as a table. In order to maintain the display panel DSP to be horizontal or substantially horizontal to the ground, the supporting legs ST may be designed to have the same length, but the present disclosure is not limited thereto. For example, the supporting legs ST may be designed to have different lengths. Alternatively, the supporting legs ST may be designed such that some of the supporting legs ST have the same length and the others of the supporting legs ST have different lengths.

The supporting leg ST may be connected to the display panel DSP to be rotatable with respect to the display panel DSP. That is, one end portion of the supporting leg ST may be rotatably connected to the display panel DSP, and the other end portion of the supporting leg ST may be in contact with the ground to support the display panel DSP.

In some embodiments, the supporting leg ST may be folded or bent by a rotating operation of the one end portion such that the other end portion becomes close to or distant from the display panel DSP. For example, the supporting leg ST may be folded or bent such that the angle formed between the supporting leg ST and the display panel DSP becomes an acute angle or obtuse angle. In this case, some of the supporting legs ST may be folded or bent, and the others of the supporting legs ST may be fixed vertically or substantially vertically to the display panel DSP.

In FIGS. 3A to 3E, it is illustrated that the display device 100 includes four supporting legs ST. However, the present disclosure is not limited thereto, and the display device 100 may include at least one supporting leg ST.

In FIG. 3C, it is illustrated that the supporting leg ST has a circular cross-section from a plan view, but the present disclosure is not limited thereto. For example, the supporting leg ST may have various suitable shapes, such as a closed-shape polygon, a shape including curved and/or straight sides, a circle, an ellipse, a semicircle, a semi-ellipse, and/or the like.

Figure 4A:
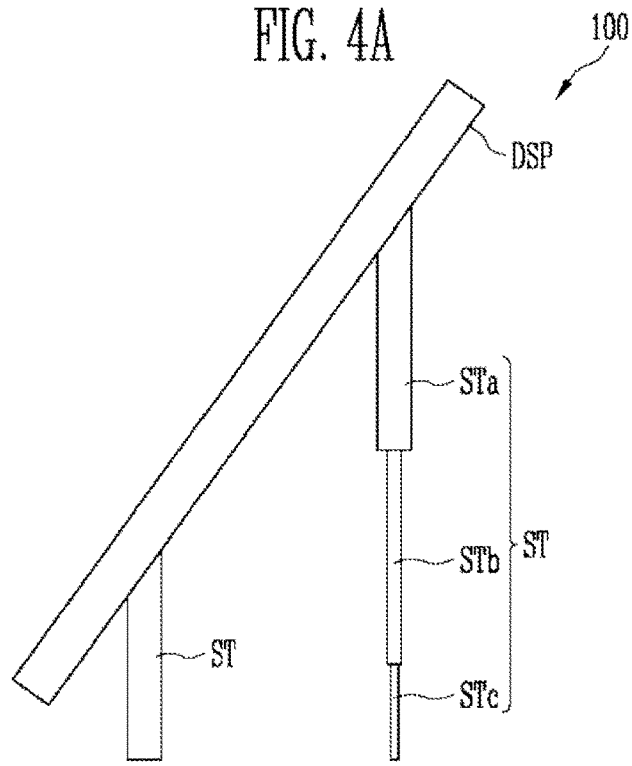
FIGS. 4A-4C are side views of a display device according to a second embodiment of the present disclosure.
Figure 4B:
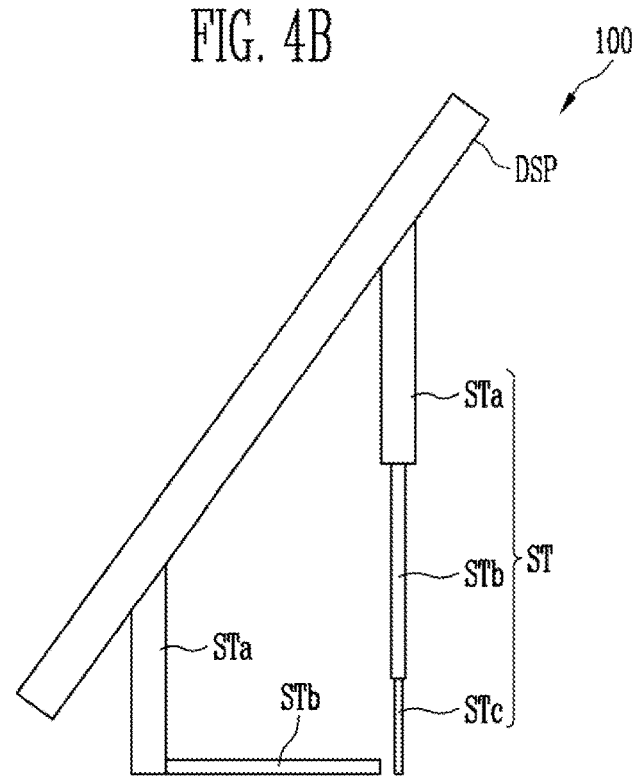
Figure 4C:
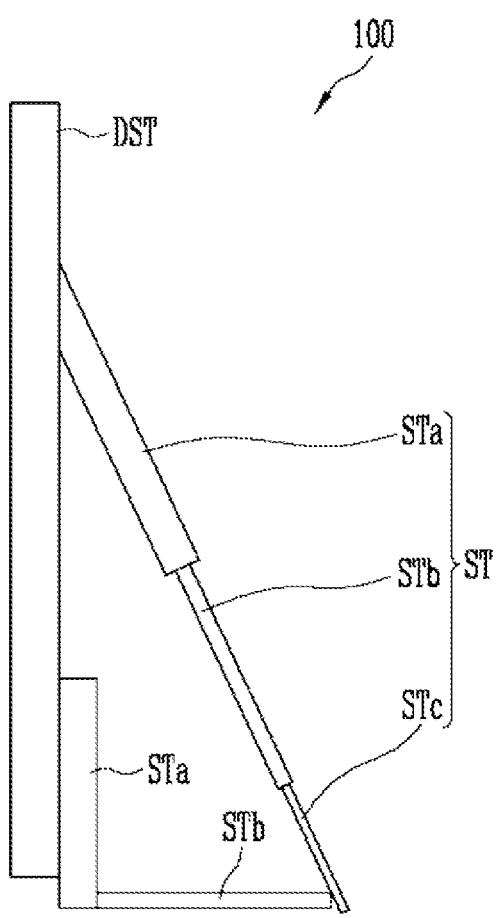

FIGS. 4A, 4B, and 4C are side views of a display device according to a second embodiment of the present disclosure.

Referring to FIG. 4A, the display device 100 according to the second embodiment may include supporting legs ST, the length of which is adjusted.

The other end portion of the supporting leg ST may extend in one direction in a state in which one end portion of the supporting leg ST is connected to a display panel DSP.

For example, the supporting leg ST may include a first supporting stick STa, a second supporting stick STb, and a third supporting stick STc. The first supporting stick STa may be formed to extend from the display panel DSP. One end portion of the second supporting stick STb may be formed to extend from the first supporting stick STa, and the other end portion of the second supporting stick STb may be connected to the third supporting stick STc. The third supporting stick STc may be formed to extend from the second supporting stick STb. The first supporting stick STa may receive the second and third supporting sticks STb and STc therein, and the second supporting stick STb may receive the third supporting stick STc therein.

In this case, the second supporting stick STb may be rotatably connected to the first supporting stick STa, and the third supporting stick STc may be rotatably connected to the second supporting stick STb.

In some embodiments, the supporting legs ST may support the display panel DSP as the supporting legs ST are configured to have different lengths. For example, some of the supporting legs ST may support the display panel DSP in a state in which the second and third supporting sticks STb and STc are received and receded in the first supporting stick STa, and the others of the supporting legs ST may support the display panel DSP as the first, second, and third supporting sticks STa, STb, and STc are in (e.g., are fixed in) a state in which the second supporting stick STb extends from the first supporting stick STa and the third supporting stick STc extends from the second supporting stick STb.

Accordingly, the display device 100 can display an image in a direction crossing the ground (e.g., being at an acute or obtuse angle with respect to the ground) instead of a direction vertical or normal to the ground.

Referring to FIG. 4B, some of the supporting legs ST may be disposed to be in contact with the ground in a state in which they are horizontal to the ground. For example, some of the supporting legs ST may support the display panel DSP as the first, second, and third supporting sticks STa, STb, and STc are in (e.g., are fixed in) a state in which the second supporting stick STb extends from the first supporting stick STa and the third supporting stick STc extends from the second supporting stick STb. In addition, the others of the supporting legs ST may support the display panel DSP in a state in which the first supporting stick STa and the second supporting stick STb are simultaneously in contact with the ground. That is, the first supporting stick STa and the second supporting stick STb may be in contact with the ground as the second supporting stick STb extends from the first supporting stick STa and is in (e.g., is fixed in) a state in which the second supporting stick STb is horizontal to the ground. As described above, when the first and second supporting sticks STa and STb are simultaneously in contact with the ground, the supporting leg ST can stably support the display panel DSP on the ground.

In some embodiments, a portion of the supporting leg ST may be fastened to another supporting leg ST in a state in which the portion of the supporting leg ST is in contact with the ground. For example, the second supporting stick STb of one supporting leg ST, which is in (e.g., is fixed in) a state in which the second supporting stick STB is in contact with the ground, may be fastened to the third supporting stick STc of another supporting leg ST, which is in contact with the ground. According to the above-described manner, the supporting legs ST can more stably support the display panel DSP on the ground.

Referring to FIG. 4C, the display device 100 may display an image that is perpendicular/normal, or substantially perpendicular/normal to the ground by using the supporting legs ST. That is, the supporting legs ST may support the display panel DSP such that the second surface of the display panel DSP is disposed in a direction vertical or normal to the ground.

For example, the first supporting stick STa of some of the supporting legs ST of the display panel DSP may support the display panel DSP as the first supporting stick STa is in contact with the second surface of the display panel DSP, and the second supporting stick STb extending from the first supporting stick STa may be in contact with the ground as the second supporting stick STb is in (e.g., is fixed in) a state in which the second supporting stick STb is horizontal to the ground. In addition, the first, second, and third supporting sticks STa, STb, and STc of each of the others of the supporting legs ST of the display panel DSP may support the display panel DSP as the first supporting stick STa extends in or is fixed in a direction crossing the ground (e.g., being at an acute or obtuse angle with respect to the ground), the second supporting stick STb extends from the first supporting stick STa, and the third supporting stick STc is in (e.g., is fixed in) a state in which the third supporting stick STc extends from the second supporting stick STb.

The display device 100 according to the second embodiment of the present disclosure can display an image by using the supporting legs ST not only in a direction crossing the ground, but also in a direction horizontal or parallel to the ground.

Although a case where the supporting leg ST includes the first to third supporting sticks STa, STb, and STc is illustrated in FIGS. 4A, 4B, and 4C, this is merely provided for convenience of description, and the present disclosure is not limited thereto. That is, the supporting leg ST according to the second embodiment of the present disclosure may include at least two supporting sticks.

Figure 5:
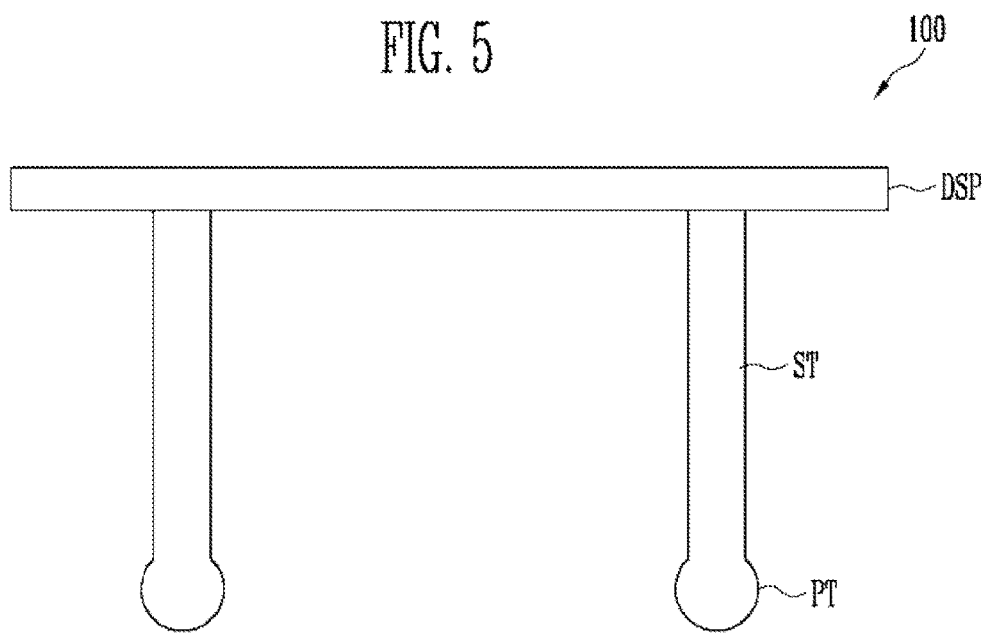
FIG. 5 is a side view of a display device according to a third embodiment of the present disclosure.

FIG. 5 is a side view of a display device according to a third embodiment of the present disclosure.

Referring to FIG. 5, the display device 100 according to the third embodiment of the present disclosure may include supporting legs ST with ends having a spherical shape. The supporting leg ST may support the display panel DST as one end portion of the supporting leg ST is connected to the display panel DSP and the other end portion of the supporting leg ST is in contact with the ground. In this case, the supporting leg ST may include a spherical protrusion part PT formed at the other end portion thereof.

The display device 100 according to the third embodiment of the present disclosure may be fixed to a wall, a ceiling, or the like by fastening the protrusion parts PT of the supporting legs ST to coupling grooves formed in the wall, the ceiling, or the like. As described above, the display device 100 according to the third embodiment of the present disclosure can be easily fixed to a wall, a ceiling, or the like by the protrusion parts PT of the supporting legs ST, without allowing a separate structure to be coupled to the display device 100.

In other embodiments, the protrusion part PT of the supporting leg ST may be modified and implemented in various suitable shapes including a polyhedron, a polyhedron having a groove formed therein, a hemisphere, a cylinder, and the like.

Figure 6:
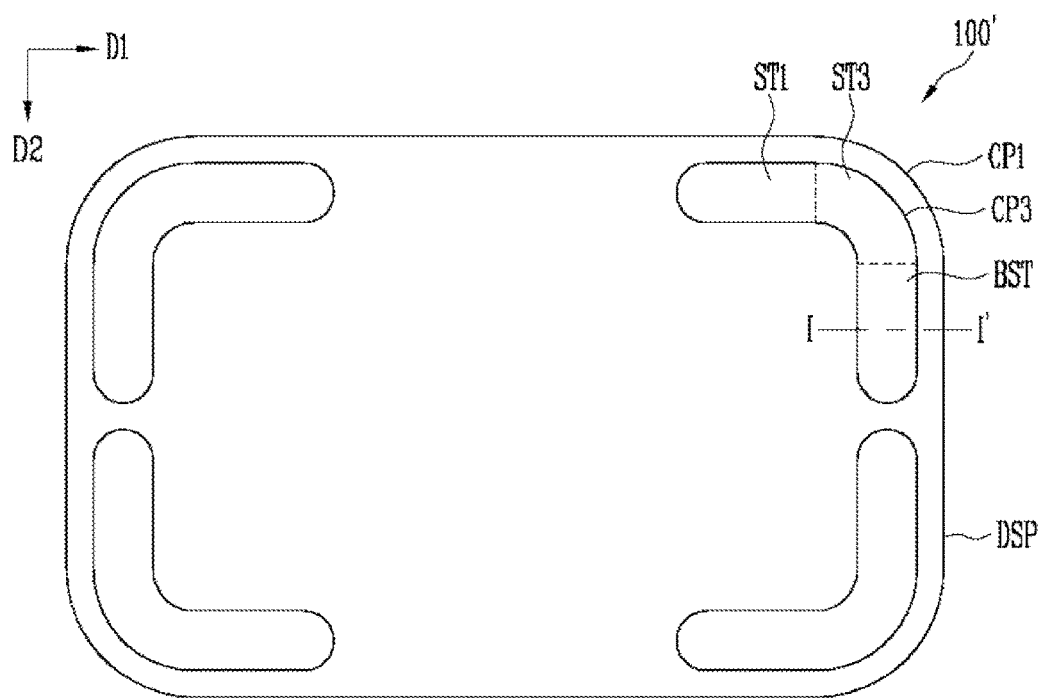
FIG. 6 is a bottom view of a display device according to a fourth embodiment of the present disclosure.
Figure 7A:
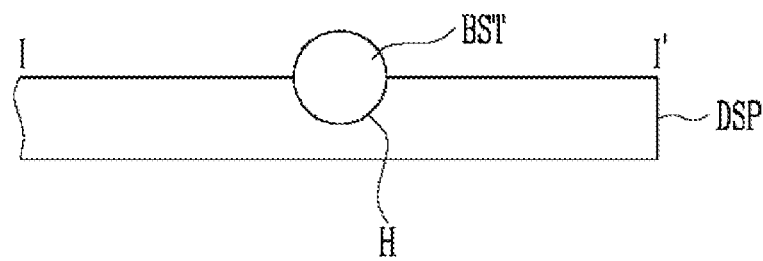
FIGS. 7A-7B are sectional views taken along the line I-I' shown in FIG. 6.
Figure 7B:
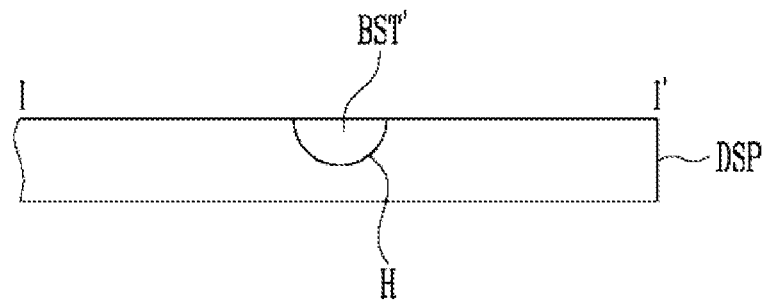

FIG. 6 is a bottom view of a display device according to a fourth embodiment of the present disclosure. FIGS. 7A and 7B are sectional views taken along the line I-I' shown in FIG. 6.

Referring to FIG. 6, the display device 100' according to the fourth embodiment of the present disclosure may include supporting legs BST having a shape corresponding to the outer circumference of a display panel DST.

The outer circumference of the display panel DSP may have a shape corresponding to the outer circumference of a light blocking member TC. The outer circumference of the display panel DSP may be formed in a rectangular shape having curved corner portions, and the supporting leg BST may be formed in a shape corresponding to the curved corner portion.

The supporting leg BST including a curved portion (hereinafter, referred to as a curved supporting leg) may include a first supporting part extending along a first direction D1, a second supporting part extending along a second direction D2, and a curved surface part that connects the first supporting part and the second supporting part to each other.

The curved surface part may have a shape corresponding to the outer circumference of the display panel DSP. The curved surface part may have the shape of a curve CP3 having a third curvature. Here, the third curvature of the curved surface part may have a value equal to or different from a first curvature of the display panel DSP.

An embodiment in which the curved supporting legs BST are formed at positions corresponding to four curved corner portions of the display device 100' is illustrated in FIG. 6. However, the present disclosure is not limited thereto, and the curved supporting legs BST may be disposed at some of the four curved corner portions.

In addition, the curved supporting legs BST may be designed to have the same length, but the present disclosure is not limited thereto. For example, the curved supporting legs BST may be designed to have different lengths. Alternatively, the curved supporting legs BST may be designed such that some of the curved supporting legs BST have the same length and the others of the curved supporting legs BST have different lengths.

Referring to FIG. 7A, the display device 100' may include a mounting groove H having a supporting leg mounted therein. The mounting groove H may be formed in a first surface of which the display panel DSP, on which no image is displayed. The mounting groove H may be provided in a number corresponding to (e.g., being the same as) that of the curved supporting legs BST.

The curved supporting leg BST may be mounted in the mounting groove H, to be mounted on the display panel DSP. That is, when the display device 100' is carried or kept, the curved supporting leg BST is mounted in the mounting groove H, so that the entire volume of the display device 100' can be reduced.

A portion of the curved supporting leg BST may be mounted in the mounting groove H, and the other portion of the curved supporting leg BST may protrude to the outside. The display device 100' can prevent the first surface of the display panel DSP from being in contact with an external environment by using a portion of the curved supporting leg BST, which protrudes to the outside.

Referring to FIG. 7B, a curved supporting leg BST' may be completely mounted in the mounting groove H not to protrude to the outside of the display panel DSP. The curved supporting leg BST' is completely received in the mounting groove H, so that the volume of the display device 100' can be minimally reduced.

In FIGS. 7A and 7B, it is illustrated that the section of the mounting groove H having the curved supporting leg BST or BST' mounted therein has a semicircular shape. However, the present disclosure is not limited thereto, and the section of the mounting groove H may be variously modified, as suitable, and implemented corresponding to the shape of the curved supporting leg BST or BST'. For example, when the section of a portion of the curved supporting leg BST or BST', which is mounted in the mounting groove H, has a quadrangular shape, the section of the mounting groove H may be implemented to have a quadrangular shape.

Figure 8A:
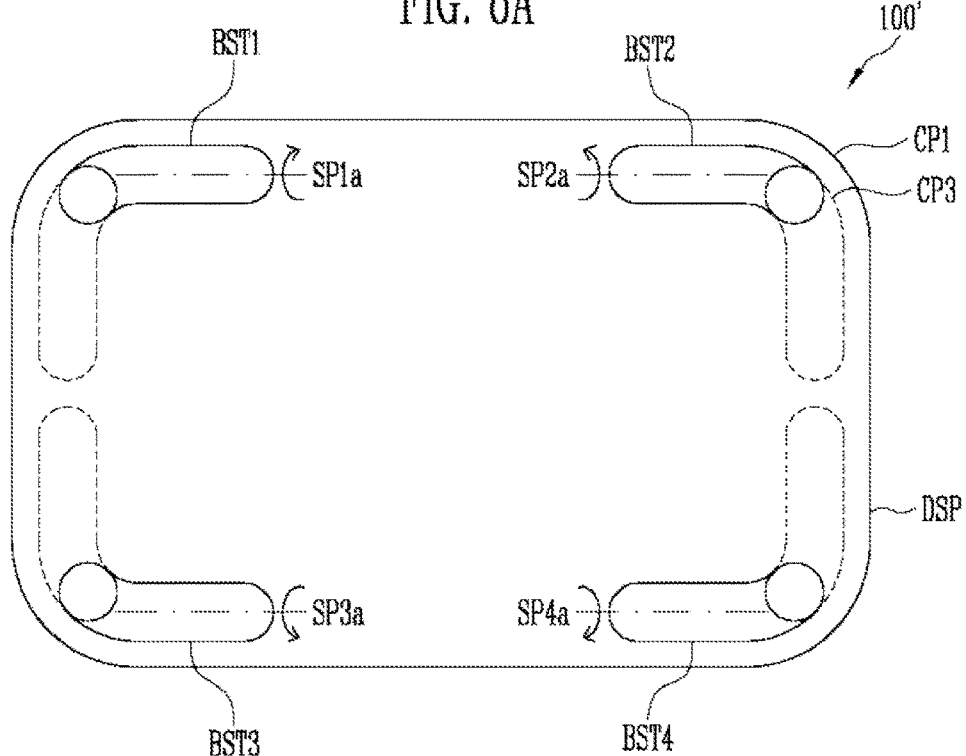
FIGS. 8A-8B are views illustrating movements of supporting legs shown in FIG. 6.
Figure 8B:
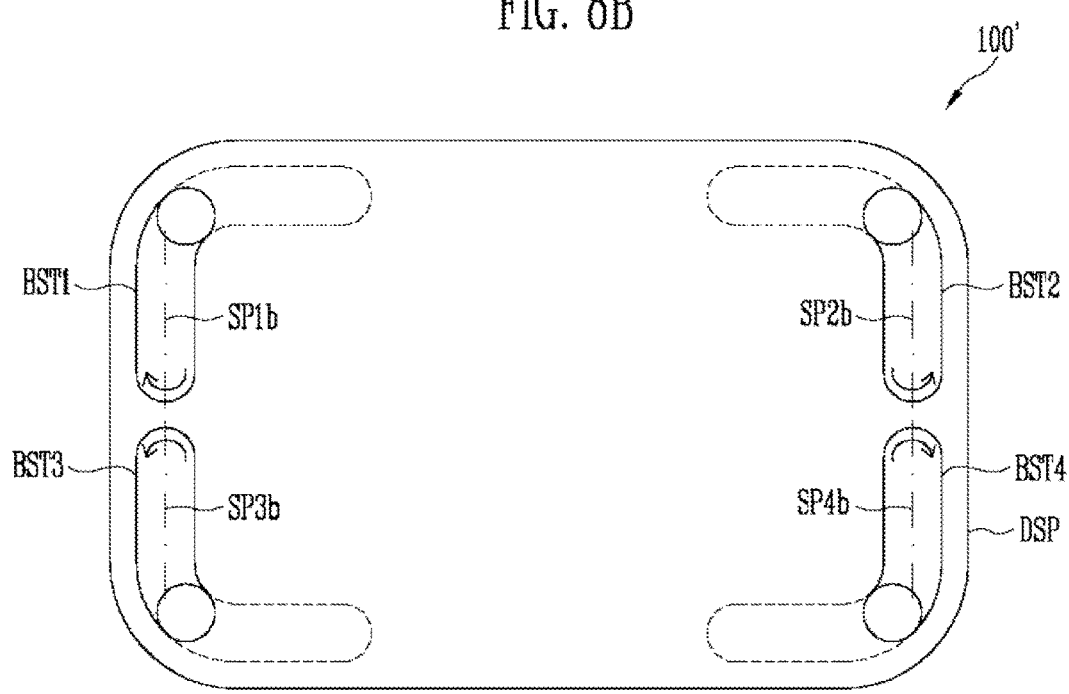

FIGS. 8A and 8B are views illustrating movements of supporting legs shown in FIG. 6.

Referring to FIGS. 8A and 8B, it is illustrated that first to fourth curved supporting legs BST1, BST2, BST3, and BST4 are detached from the display panel DSP by rotational movements thereof.

For example, each of the first to fourth curved supporting legs BST1, BST2, BST3, and BST4 includes a first supporting part, a second supporting part, and a curved surface part. If any one of the first supporting part and the second supporting part is rotated in the mounting groove H, the other of the first supporting part and the second supporting part may be detached from the display panel DSP. Because the first supporting part and the second supporting part are connected to each other through the curved surface part, the rotational movement of any one of the first supporting part and the second supporting part may be transferred to the other of the first supporting part and the second supporting part through the curved surface part.

For example, when the first supporting part of the second curved supporting leg BST2 is rotated in the mounting groove H with respect to a first rotational axis SP2$a$, the second supporting part may be detached from the display panel DSP. That is, the second supporting part may be disposed to be spaced apart from the plane of the display panel DSP.

In this manner, the first to fourth curved supporting legs BST1, BST2, BST3, and BST4 are rotated with respect to first rotational axes SP1$a$, SP2$a$, SP3$a$, and SP4$a$, respectively, to be detached from the display panel DSP.

For example, when the second supporting part of the second curved supporting leg is rotated in the mounting groove H with respect to a second rotational axis SP2$b$, the first supporting part may be detached from the display device DSP. That is, the first supporting part may be disposed to be spaced apart from the plane of the display panel DSP.

In this manner, the first to fourth curved supporting legs BST1, BST2, BST3, and BST4 are rotated with respect to second rotational axes SP1$b$, SP2$b$, SP3$b$, and SP4$b$, respectively, to be detached from the display panel DSP.

In some embodiments, portions of the first to fourth curved supporting legs BST1, BST2, BST3, and BST4 may be disposed in a state in which each of the portions is mounted in the mounting groove H, and only the other portions may be rotated with respect to the first rotational axes SP1$a$, SP2$a$, SP3$a$, and SP4$a$ or the second rotational axes SP1$b$, SP2$b$, SP3$b$, and SP4$b$.

FIGS. 9A, 9B, 9C, 9D, and 9E are side views of the display device 100' according to the fourth embodiment of the present disclosure.

Figure 9A:
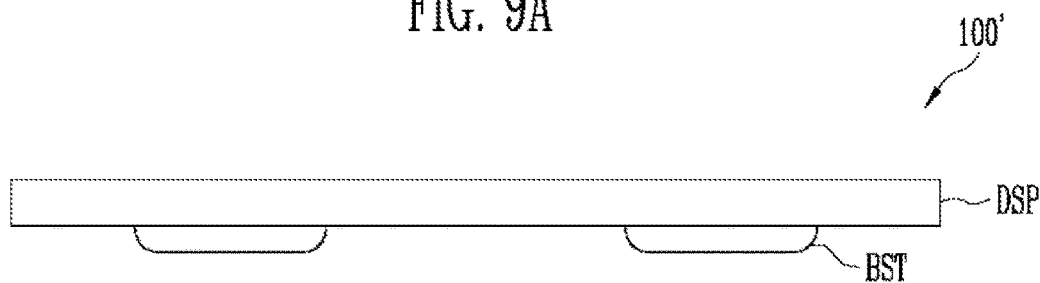
FIGS. 9A-9E are side views of the display device according to the fourth embodiment of the present disclosure.

Referring to FIG. 9A, there is illustrated a state in which the curved supporting leg BST is mounted in the mounting groove H of the display panel DSP. The curved supporting leg BST may have a shape in which a portion of the curved supporting leg BST is received in the mounting groove H and the other portion protrudes from the display panel DSP.

The display device 100' may be disposed such that the display panel DSP is spaced apart from an external environment at a certain distance by the protruding shape of the curved supporting leg BST.

Figure 9B:
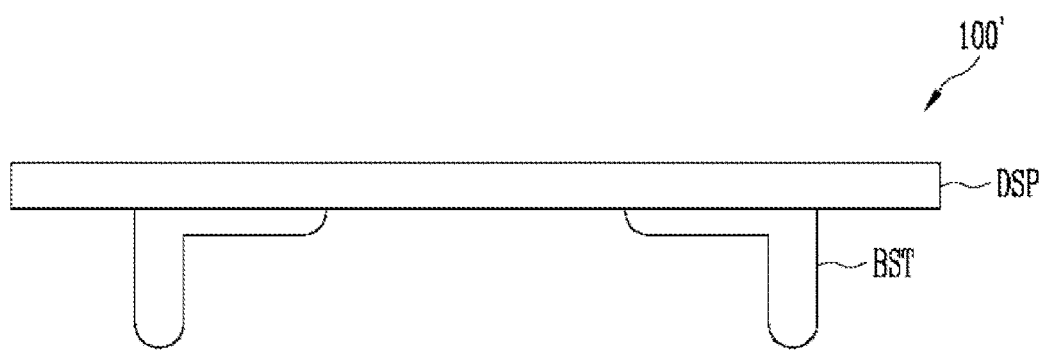

Referring to FIG. 9B, there is illustrated a state in which, as the curved supporting leg BST is rotated, a portion of the curved supporting leg BST is detached from the display panel DSP. The curved supporting leg BST may be in contact with the ground or the like to support the display panel DSP.

In FIG. 9B, it is illustrated that, the four curved supporting legs BST are all rotated to be detached from the display panel DSP. However, the present disclosure is not limited thereto, and only some of the four curved supporting legs BST may be rotated to be detached from the display panel DSP.

Figure 9C:
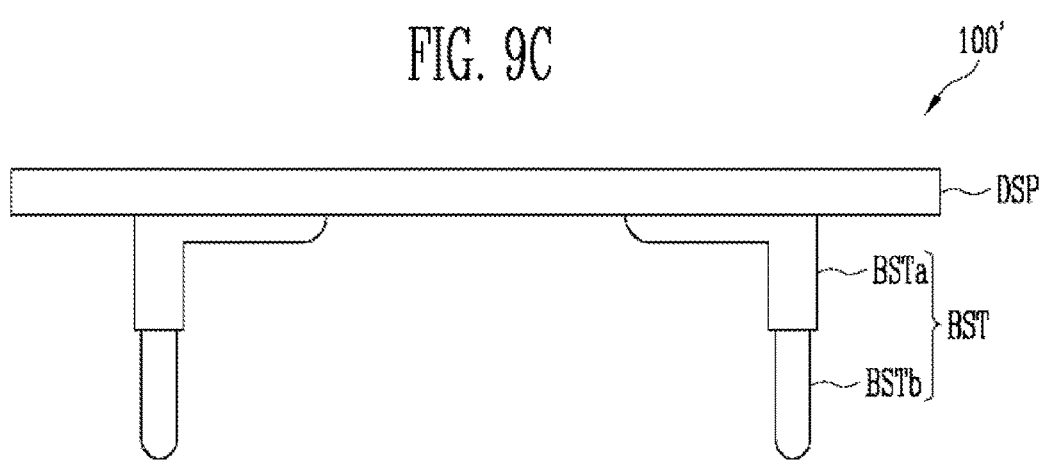
Figure 9D:
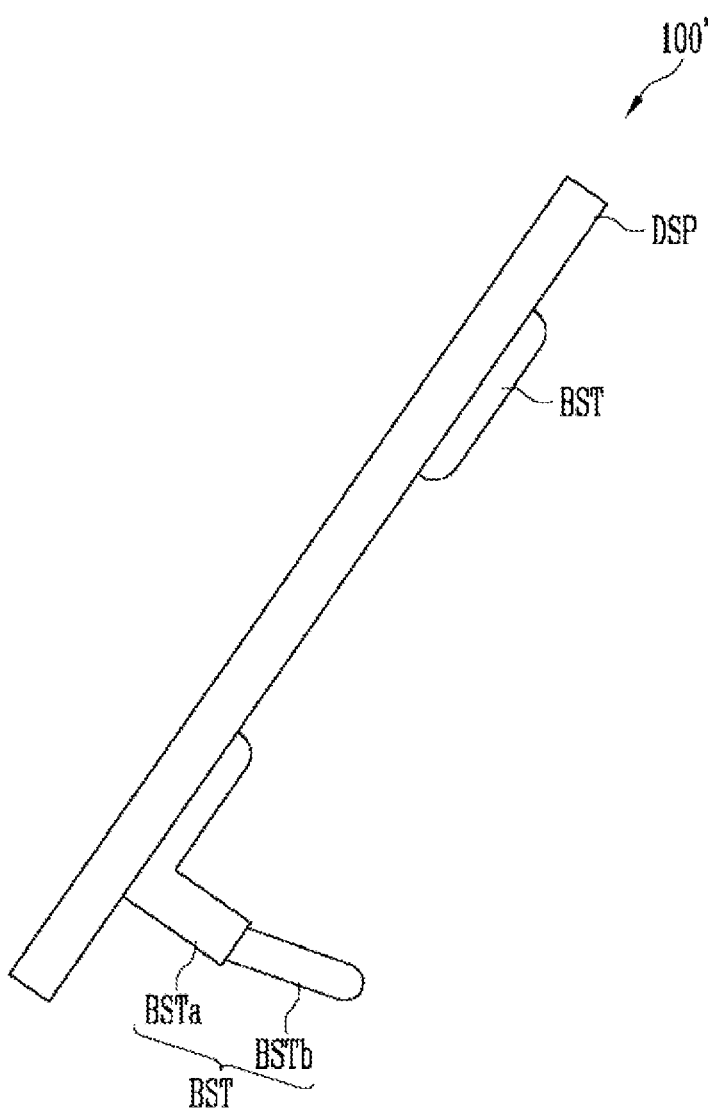

Referring to FIGS. 9C and 9D, the length of the curved supporting leg BST may be adjusted. The curved supporting leg BST may include a first curved supporting part BSTa and a second curved supporting part BSTb. The first curved supporting part BSTa may refer to a part of the curved supporting leg BST, which is detached from the display panel DSP. The second curved supporting part BSTb may be formed to extend from the first curved supporting part BSTa. The second curved supporting part BSTb may be rotatably connected to the first curved supporting part BSTa. The second curved supporting part BSTb may be received in the first curved supporting part BSTa.

As described above, in the display device 100' according to the fourth embodiment of the present disclosure, the display panel DSP can be disposed to be spaced apart from the ground or the like at a relatively wide distance by using the second curved supporting part BSTb.

In addition, a portion of the curved supporting leg BST may be disposed in a state in which the portion is mounted in the mounting groove H, and only the other portion may be detached from the display panel DSP by the rotation thereof to support the display panel DSP. In this case, the second curved supporting part BSTb may be rotated to be disposed in a direction crossing the extending direction of the first curved supporting part BSTa.

As described above, in the display device 100' according to the fourth embodiment of the present disclosure, the second surface of the display panel DSP can be disposed in a direction crossing the ground by using the curved supporting leg BST, and accordingly, an image can be displayed in the direction crossing the ground.

Figure 9E:
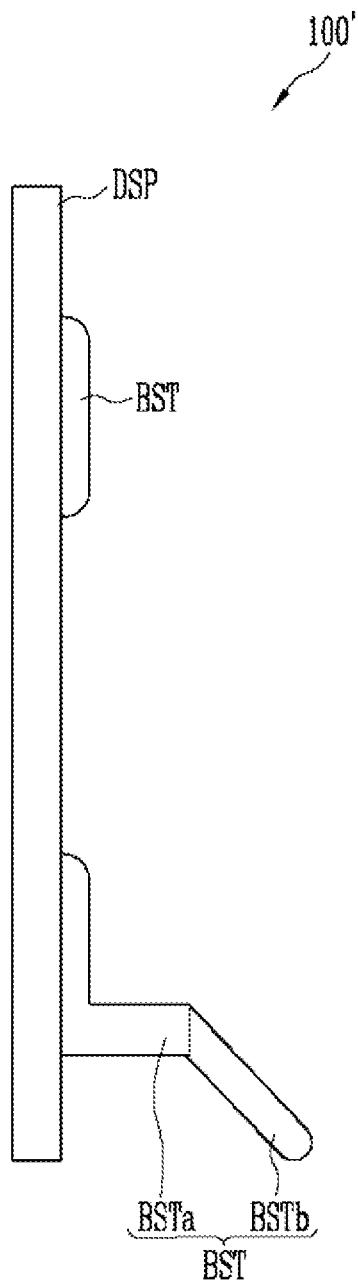

Referring to FIG. 9E, the display device 100' may display an image that is perpendicular or substantially perpendicular to the ground by using the curved supporting leg BST. That is, the curved supporting leg BST may support the display panel DSP such that the second surface of the display panel DSP, on which an image is displayed, is disposed in a direction vertical or substantially vertical to the ground.

For example, the second curved supporting part BSTb of the curved supporting leg BST may extend from the first curved supporting part BSTa and be in contact with the ground such that the second surface of the display panel DSP is disposed in the direction vertical or substantially vertical to the ground.

As described above, the display device 100' according to the fourth embodiment of the present disclosure can display an image not only in a direction crossing the ground, but also in a direction horizontal or substantially horizontal to the ground by using the curved supporting legs BST.

Figure 10:
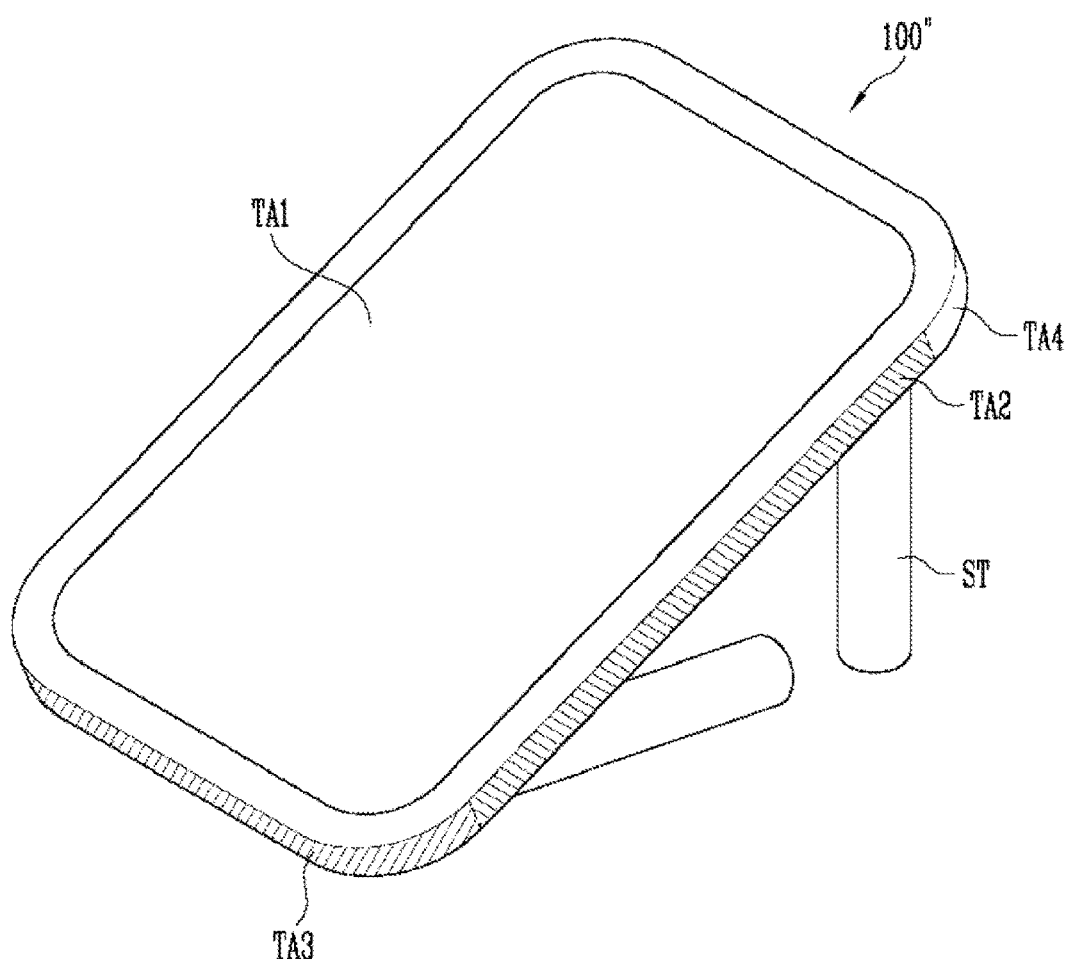
FIG. 10 is a perspective view of a display device according to a fifth embodiment of the present disclosure.
Figure 11:
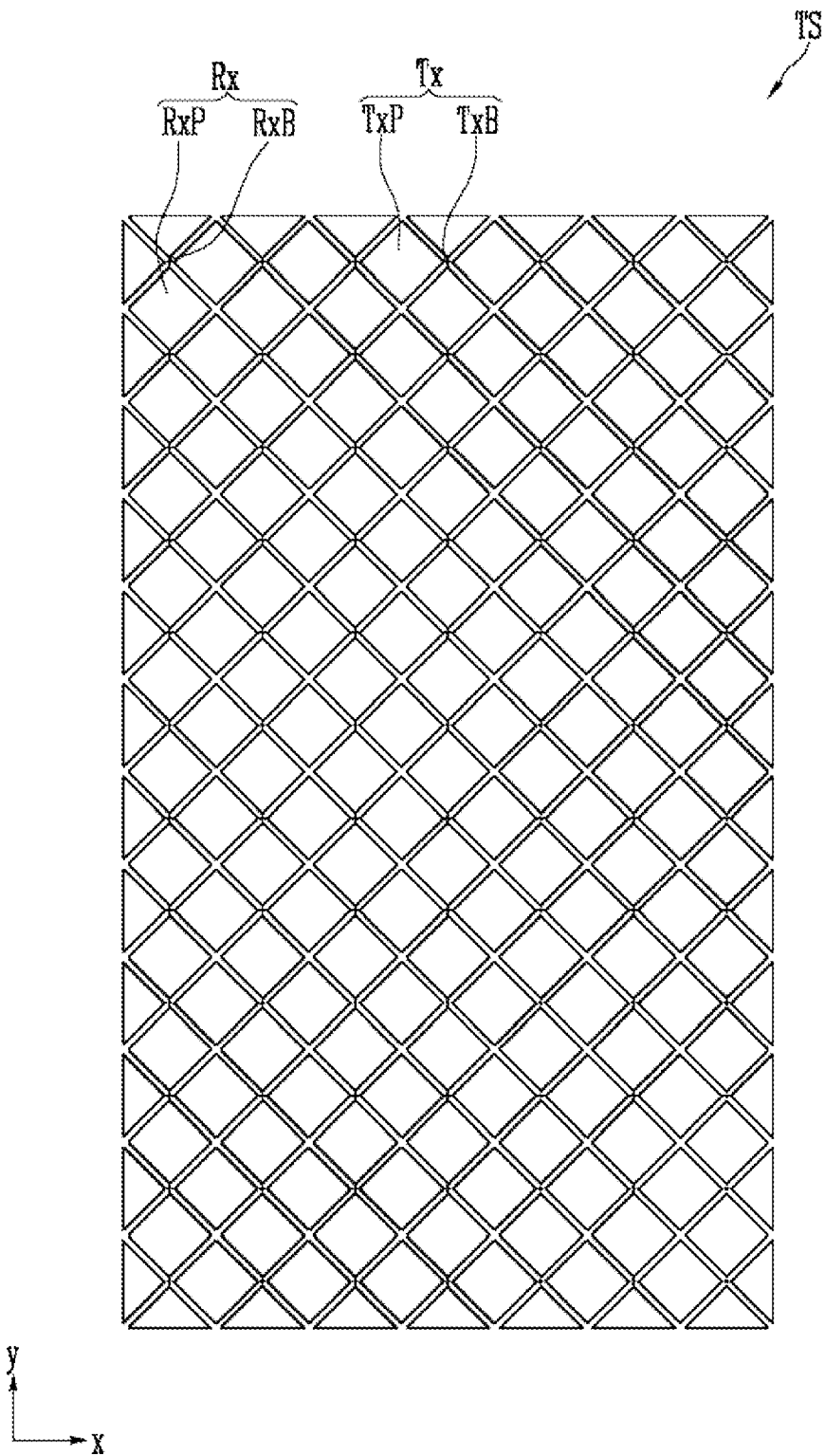
FIG. 11 is a view schematically illustrating a touch sensor according to an embodiment of the present disclosure.
Figure 12:
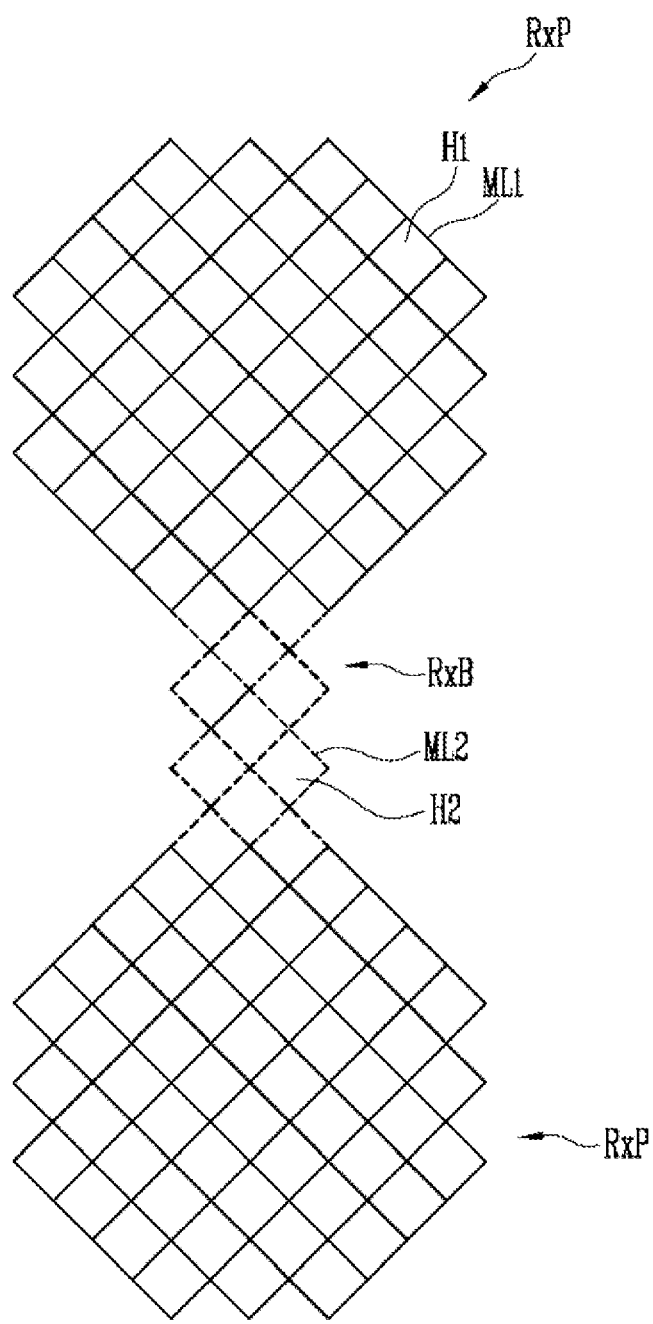
FIG. 12 is a view schematically illustrating sensing cells according to the embodiment of the present disclosure.

FIG. 10 is a perspective view of a display device according to a fifth embodiment of the present disclosure. FIG. 11 is a view schematically illustrating a touch sensor according to an embodiment of the present disclosure. FIG. 12 is a view schematically illustrating sensing cells according to the embodiment of the present disclosure.

Referring to FIG. 10, the display device 100" according to the fifth embodiment of the present disclosure may include a touch sensor TS. The display device 100" may include first to fourth touch areas defined by the touch sensor.

For example, a first touch area may be defined by the first touch sensor on one surface of the display device 100", on which an image is displayed, and the second to fourth touch areas may be defined by a second touch sensor on a side surface of the display device 100".

In this case, the first and second touch sensors may be driven independently from each other. However, the present disclosure is not limited thereto, and the first and second touch sensors may be implemented in a single body to be concurrently (e.g., simultaneously) driven.

The side surface of the display device 100" may be divided into the second to fourth areas according to the driving method of the second touch sensor. The second touch sensor, under the control of the display device 100", may concurrently (e.g., simultaneously) sense touches in the second to fourth areas, or sense touches in some areas among the second to fourth touch areas.

For example, when some of supporting legs ST are folded in a direction adjacent to a display panel DSP and the others of the supporting legs ST support the display panel DSP, the display device 100" may control the second touch sensor such that the third touch area adjacent to the ground is deactivated or non-activated. In this case, the second touch sensor, corresponding to the control of the display device 100", may allow the second and fourth touch areas to be activated, and allow the third touch area to be deactivated or non-activated. That is, although a touch is generated in the third touch area, the second touch sensor cannot sense the touch, and may sense only touches generated in the second and fourth touch areas.

In some embodiments, the display device 100" may control the second touch sensor, corresponding to an angle formed between the plane of the display panel DSP and the ground. For example, the display device 100" may further include a sensor that senses the horizontality of the display panel DSP. When the display panel DSP is not horizontal or substantially horizontal to the ground, the display device 100" may control the second touch sensor such that a side surface touch area close to the ground is deactivated or non-activated.

In FIG. 10, it is illustrated that the side surface touch area is limited to the second to fourth touch areas. However, this is provided for convenience of description, and the present disclosure is not limited thereto. The side surface touch area may be formed on a side surface of the display panel DSP. The side surface touch area may be divided into a number of areas that are smaller or greater than the number of the second to fourth touch areas.

Referring to FIG. 11, the touch sensor TS according to the embodiment of the present disclosure includes driving electrodes Tx and sensing electrode Rx.

The touch sensor TS of the present disclosure may calculate a touch position by providing a driving signal to the driving electrodes Tx and receiving a sensing signal generated corresponding to a touch operation from the sensing electrodes Rx.

The driving electrodes Tx and the sensing electrodes Rx may be formed to cross each other.

The driving electrodes Tx may include a plurality of driving cells TxP arranged at a set or predetermined distance or interval along an x-axis direction, and a plurality of driving patterns TxB that allow the driving cells TxP to be electrically connected to each other.

The sensing electrodes Rx may include a plurality of sensing cells RxP that are arranged at a set or predetermined distance or interval along a y-axis direction and are distributed and disposed between the driving cells TxP, and a plurality of sensing patterns RxB that allow the sensing cells RxP to be electrically connected to each other.

The driving cells TxP and the sensing cells RxP may be formed of a transparent conductive material such as indium tin oxide (ITO), carbon nanotube (CNT), graphene, and/or the like.

In addition, the driving cells TxP and the sensing cells RxP may be formed of the transparent conductive material or be formed of a metallic material.

Driving lines may be connected between the driving cells TxP and connection pads, and sensing lines may be connected between the sensing cells RxP and connection pads.

Each of the first touch sensor and the second touch sensor, which are described in FIG. 10, may include the driving electrodes Tx and the sensing electrodes Rx, which are shown in FIG. 11, and numbers of driving cells TxP and sensing cells RxP, which are included in the first touch sensor, may be different from those of driving cells TxP and sensing cells RxP, which are included in the second touch sensor.

Referring to FIG. 12, there are illustrated sensing cells RxP and a sensing pattern RxB, which are included in sensing electrodes Rx. For convenience of description, the sensing cells RxP are indicated by a solid line and the sensing pattern RxB is indicated by a dotted line.

As described above, the sensing cells RxP may be arranged in a certain direction, and the sensing pattern RxB may connect the adjacent sensing cells RxP to each other.

Each of the sensing cells RxP may have a mesh shape including a plurality of openings H1. To this end, the sensing cells RxP may include thin metal lines ML1 that form the plurality of openings H1 therebetween.

Like the sensing cells RxP, the sensing pattern RxB may have a mesh including a plurality of openings H2. To this end, the sensing pattern RxB may include thin metal lines ML2 that form the plurality of openings H2 therebetween.

Here, the sensing electrodes Rx is mainly described, but the driving electrode Tx may also have the same shape as the sensing electrodes Rx.

In the display device according to the present disclosure, the display device can be used as a table, a mirror, etc., or be used as a standing-type (standing-kind) display device by using supporting legs connected to one surface the display panel having curved corner portions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as defined by the following claims and equivalents thereof.

What is claimed is:

1. A display device comprising:
   a display panel comprising a plurality of pixels configured to display an image, and further comprising a light blocking member on the pixels to define a display area and a non-display area, the light blocking member having a curvature part; and
   a supporting leg connected to a first surface of the display panel to support the display panel,
   wherein the plurality of pixels comprise:
      a first pixel that does not overlap with the curvature part from a plan view; and
      a second pixel partial overlapping with the curvature part,
   wherein the first and second pixels are configured to display the image on a second surface of the display panel opposite to the first surface, and
   wherein the supporting leg comprises:
      a first supporting stick rotatably connected to the display panel and extending away from the display panel; and
      a second supporting stick extending from the first supporting stick away from display panel, the second supporting stick being rotatably connected to the first supporting stick.

2. The display device of claim 1, wherein one end portion of the supporting leg is rotatably connected to the display panel.

3. The display device of claim 2, wherein an other end portion of the supporting leg is formed in a spherical shape.

4. The display device of claim 1, wherein the supporting leg is configured to have an adjustable length.

5. The display device of claim 1, wherein the display panel further comprises a mounting groove that allows the supporting leg to be mounted on the first surface.

6. The display device of claim 5, wherein, from the plan view, a circumference of the display panel has a straight line and a curve having a first curvature, and
   wherein the mounting groove has a shape corresponding to the curve and has a second curvature.

7. The display device of claim 6, wherein the supporting leg has a shape corresponding to the mounting groove and is configured to be mounted in the mounting groove.

8. The display device of claim 7, wherein the supporting leg comprises:
   a first supporting part extending along a first direction;
   a second supporting part extending along a second direction crossing the first direction; and
   a curved surface part connecting the first supporting part and the second supporting part to each other.

9. The display device of claim 8, wherein, when the first supporting part is rotated in the mounting groove, the second supporting part is detached from the mounting groove, and
   wherein, when the second supporting part is rotated in the mounting groove, the first supporting part is detached from the mounting groove.

10. The display device of claim 6, wherein the first curvature and the second curvature are equal to each other.

11. The display device of claim 6, wherein the first curvature and the second curvature are different from each other.

12. The display device of claim 1, further comprising:
a first touch sensor on the second surface; and
a second touch sensor on a side surface of the display panel, the side surface connecting a circumference of the first surface and a circumference of the second surface to each other.

13. The display device of claim 12, wherein the side surface of the display panel comprises a plurality of touch areas defined by the second touch sensor,
wherein the second touch sensor is configured to allow the touch areas to be all activated, or to allow some of the touch areas to be activated and others of the touch areas to be non-activated.

14. The display device of claim 13, wherein the second touch sensor is configured to allow the touch areas to be activated or non-activated corresponding to an angle formed between the first surface of the display panel and the ground.

15. The display device of claim 1, wherein the supporting leg supports the display panel such that the second surface of the display panel extends in a direction crossing the ground.

16. The display device of claim 1, wherein the supporting leg supports the display panel such that the second surface of the display panel extends in a direction normal to the ground.

* * * * *